United States Patent
Tashibu

[19]

[11] Patent Number: 5,781,035
[45] Date of Patent: Jul. 14, 1998

[54] DUAL-DIFFERENTIAL-PAIR EMITTER-COUPLED LOGIC COMPLEMENTARY-OUTPUT CIRCUIT

[75] Inventor: Masakazu Tashibu, Yokohama, Japan

[73] Assignee: Kabushiki Kaisha Toshiba, Kawasaki, Japan

[21] Appl. No.: 678,780

[22] Filed: Jul. 11, 1996

[30] Foreign Application Priority Data

Jul. 12, 1995  [JP]  Japan .................................. 7-176028

[51] Int. Cl.$^6$ .................... H03K 19/086; H03K 19/013
[52] U.S. Cl. .................................. 326/126; 326/18
[58] Field of Search ............................ 326/126, 18

[56] References Cited

U.S. PATENT DOCUMENTS

| | | | |
|---|---|---|---|
| 4,347,446 | 8/1982 | Price | 326/126 |
| 5,381,057 | 1/1995 | Kuroda et al. | 326/126 |
| 5,514,984 | 5/1996 | Nakamura | 326/126 |

FOREIGN PATENT DOCUMENTS 7-58617   3/1995   Japan .
7-142991  6/1995   Japan .

OTHER PUBLICATIONS

"Capacitor–Free Level–Sensitive Active Pull–Down ECL Circuit with Self–Adjusting Driving Capability," Tadahiro Kuroda, et al. IEEE Journal Of Solid–State Circuits, vol. 31, No. 6, Jun. 1996; pp. 819–827.

*Primary Examiner*—David C. Nelms
*Assistant Examiner*—Trong Phan
*Attorney, Agent, or Firm*—Oblon, Spivak, McClelland, Maier & Neustadt, P.C.

[57] ABSTRACT

A complementary-output vertically-stacked ECL gate circuit is disclosed which is low in power dissipation and fast in operation. The ECL gate circuit has a dual differential pair circuit arrangement provided with a pair of complementary outputs and an active pull-down circuit at each of the outputs. This arrangement allows complementary currents to flow through current switching circuits for the respective differential pair circuits and thus provides complementary outputs with built-in active pull-down circuits.

11 Claims, 10 Drawing Sheets

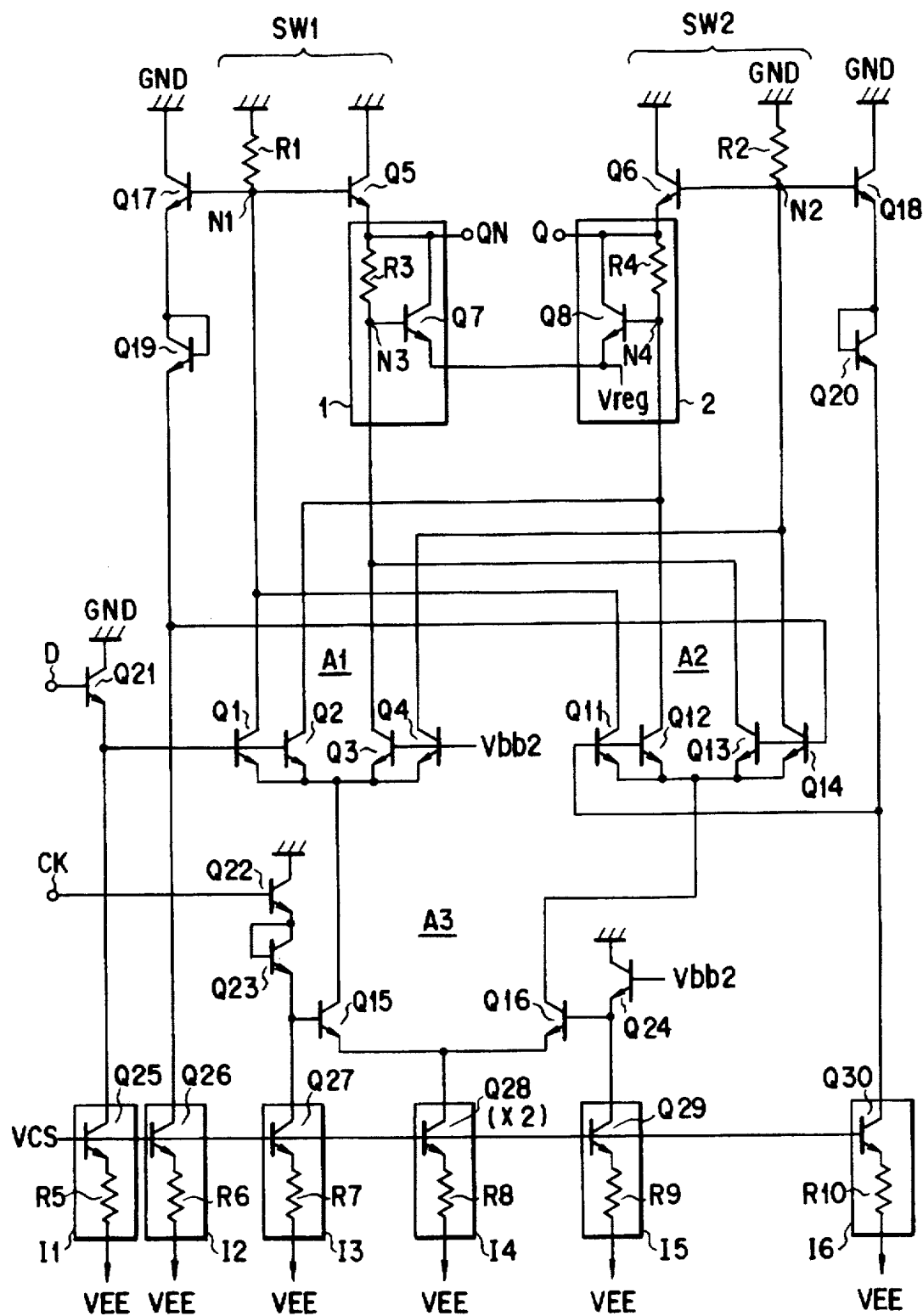
F I G. 7

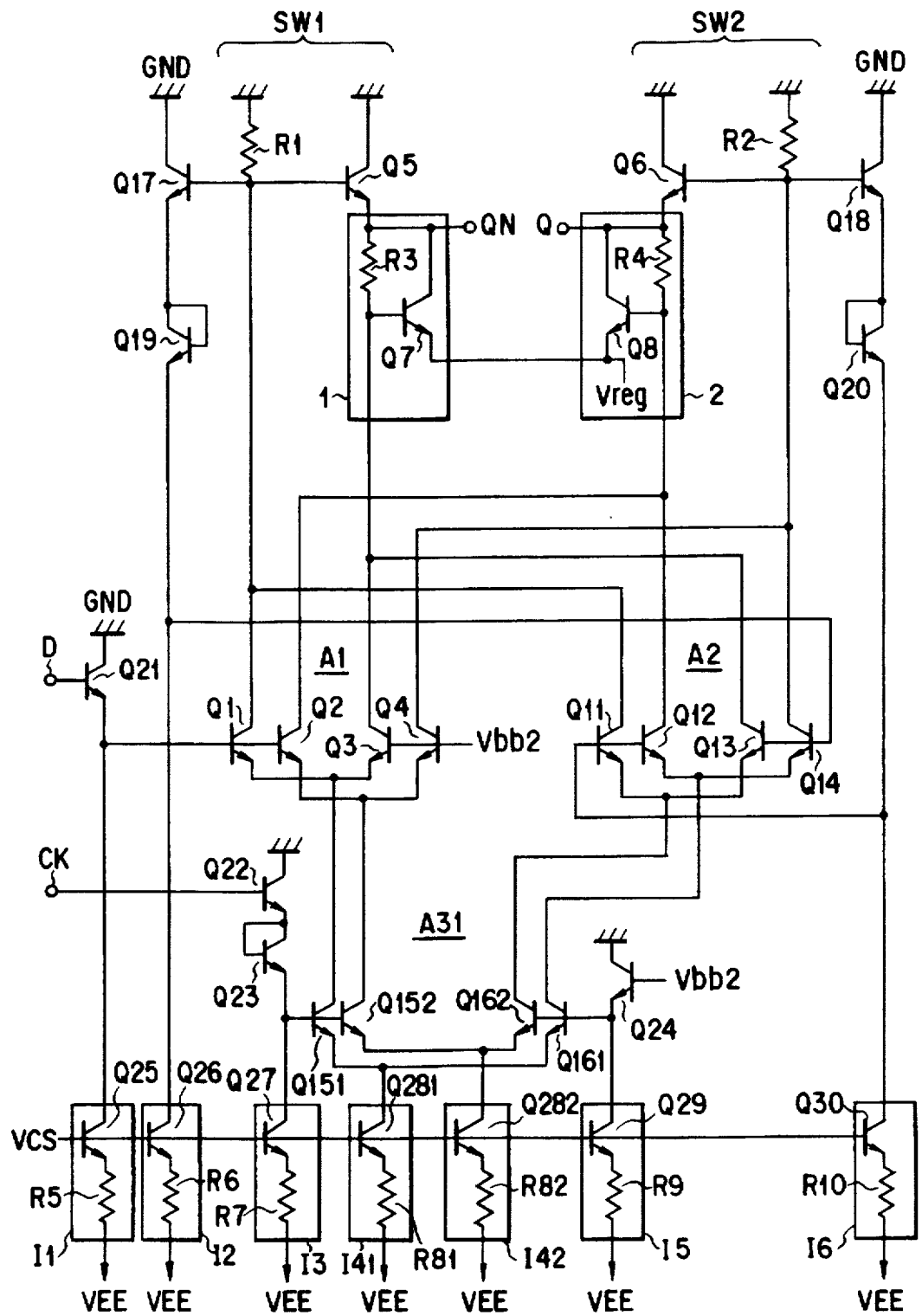
F I G. 8

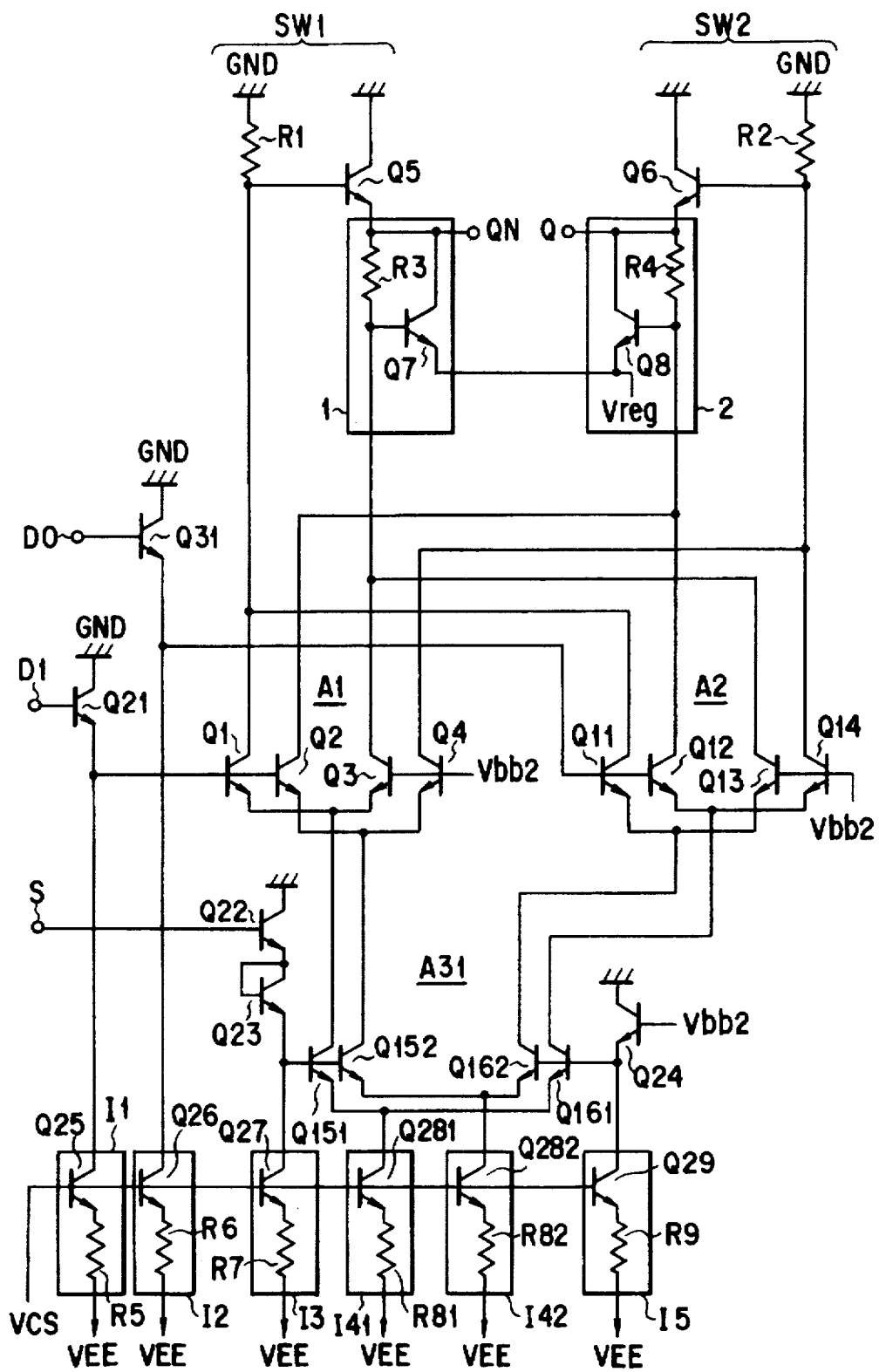
F I G. 9

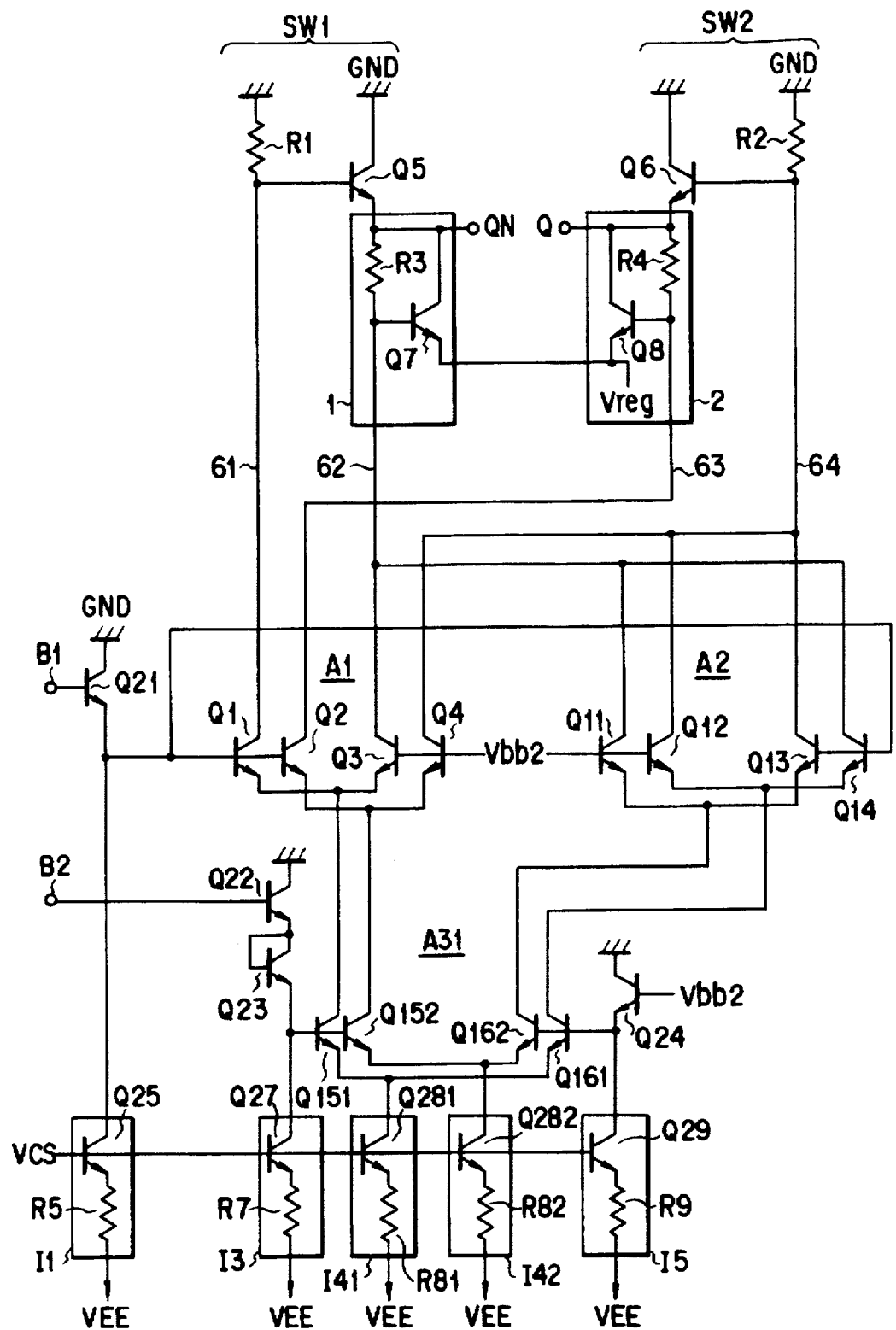
F I G. 10

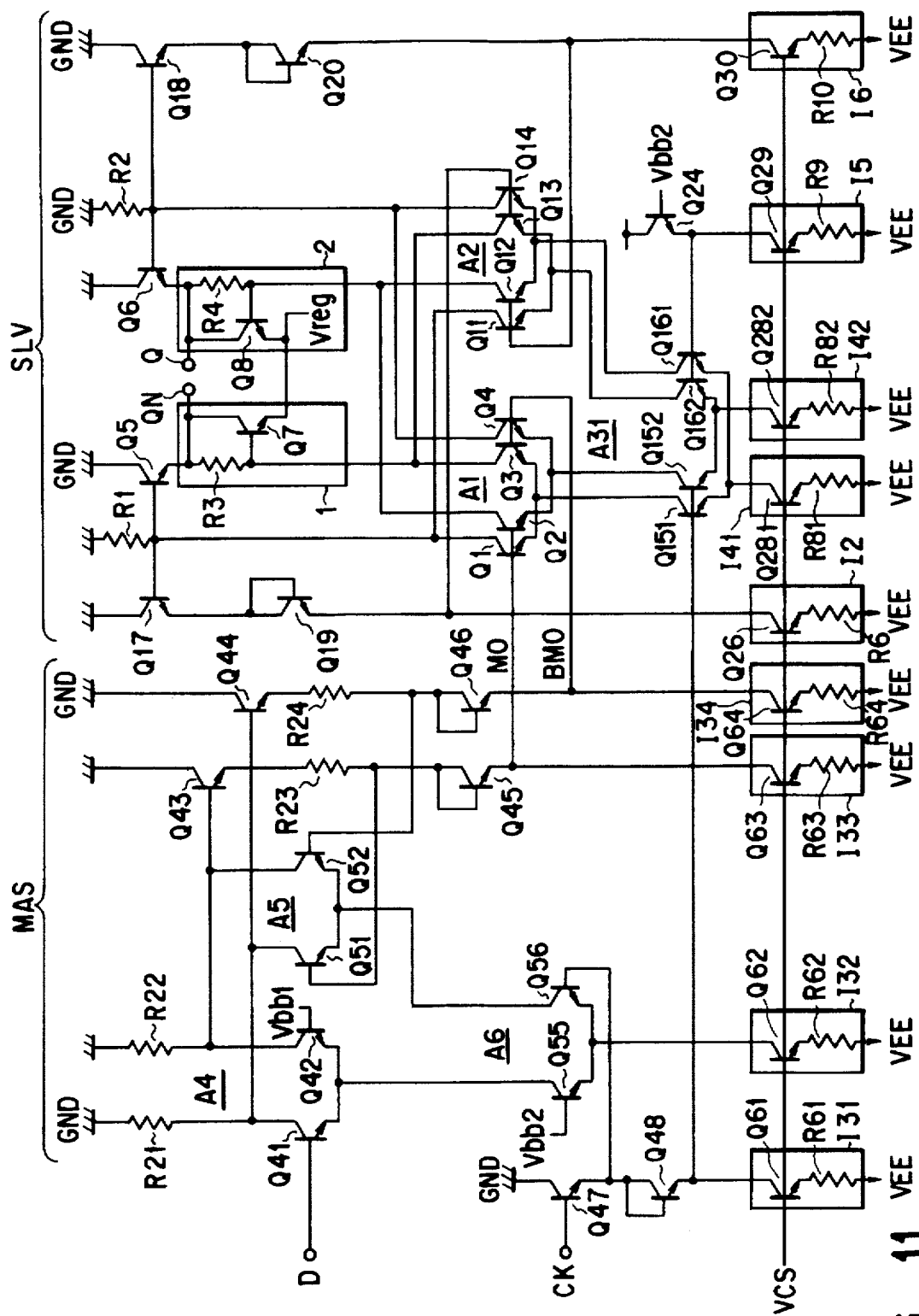
F I G. 11

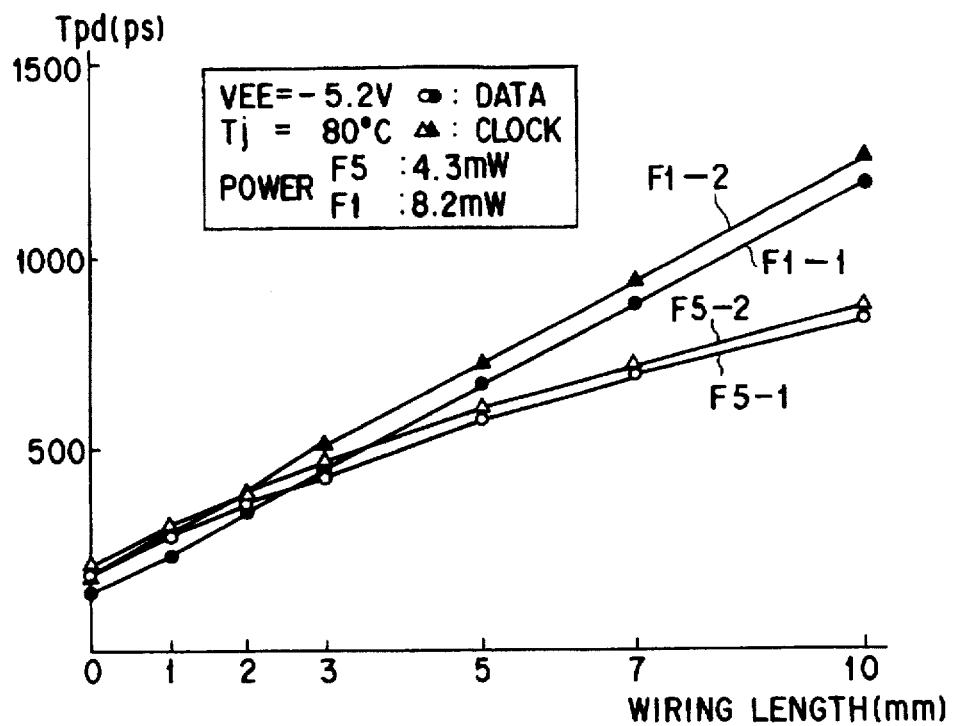
F I G. 12
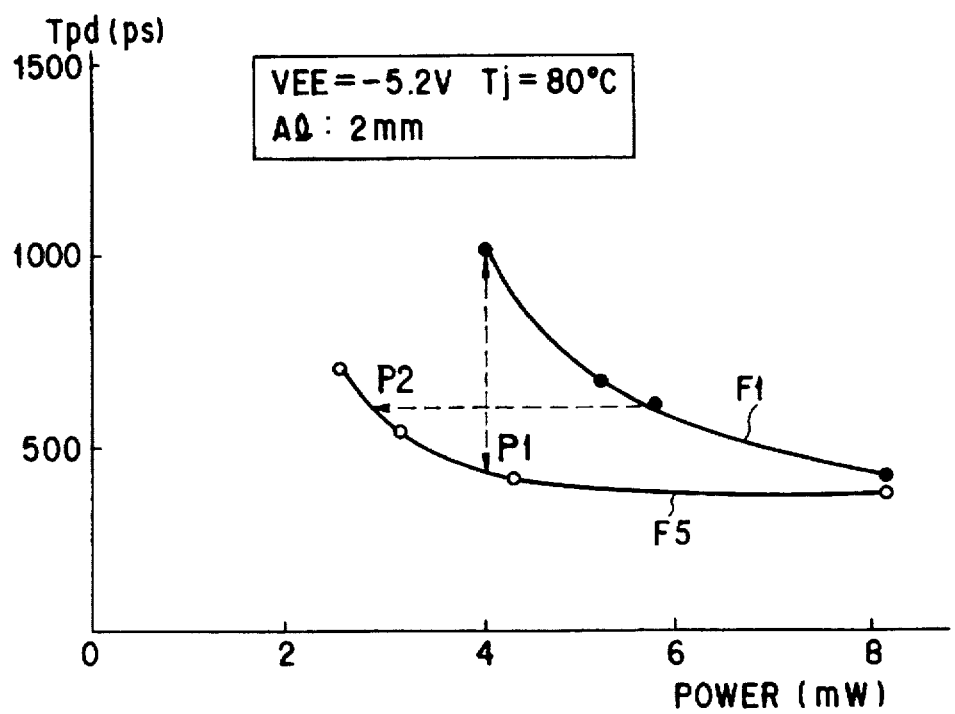
F I G. 13

DUAL-DIFFERENTIAL-PAIR EMITTER-COUPLED LOGIC COMPLEMENTARY-OUTPUT CIRCUIT

BACKGROUND OF THE INVENTION

1. Field of the Invention

The invention relates to an emitter-coupled logic (ECL) circuit adapted for an ECL gate, specially adapted for use in a very-high-speed low-power-dissipation bipolar circuit.

2. Description of the Related Art

An arrangement in which an operation control current path of a differential pair is used as a differential current path of the next differential pair is called a vertically stacked arrangement. FIG. 1 shows a complementary output type of D-latch circuit which is a typical example of a vertically stacked ECL gate. The high-potential power supply is ground (GND) and the low-potential power supply is VEE (negative). Each of the collectors (nodes N11 and N12) of a differential pair A11 is coupled with a respective one of the collectors of a differential pair A12. The emitter currents of the respective differential pairs A11 and A12 serve as the differential currents of a differential pair A13. The node N11 is coupled with the common bases of transistors Q109 and Q111, while the node N12 is coupled with the common bases of transistors Q108 and Q110. The emitters of the transistors Q110 and Q111 are coupled with complementary output terminals Q and QN, respectively. The emitters of the transistors Q108 and Q109 are respectively coupled with the bases of transistors Q103 and Q104 of the differential pair A12 through their respective emitter resistors R103 and R104. Each of transistors Q112 to Q117 having their respective bases connected to a constant voltage VCS and a corresponding respective one of resistors R105 to R110 constitute a constant current source. In the differential pair A11, the base of the transistor Q101 is used as a data input terminal, while the base of the transistor Q102 is connected to a predetermined potential Vbb1. In the differential pair A13, the transistor Q107 has its base connected to the emitter of a transistor Q105 which is turned on and off by a clock CK, while the transistor Q106 has its base connected to a predetermined potential Vbb2.

In the above arrangement, when the clock CK goes low, the transistor Q106 turns on, enabling the differential pair A11. For example, when the input terminal D is at a high level, the transistor Q101 is on, so that a current flows through a resistor R101 and the potential V1 at the node N11 goes low. On the other hand, the potential V2 at the node N12 remains at ground. The potentials V1 and V2 provide a low-level output and a high-level output at the outputs QN and Q, respectively. When the clock CK next goes high, the transistor Q107 of the differential pair A13 will turn on, enabling the differential pair A12. Thus, data corresponding to V1 and V2 so far is fed into the differential pair A12. Thereby, while the clock CK is high, the output terminals Q and QN hold the previous state (the state so far, i.e., the state immediately before the clock CK goes low) even if the next data is applied to the input terminal D.

The operating speed of the circuit thus arranged depends greatly on the switching current (ISW) which is the emitter current of the differential pair A13 and the output currents (IOEF) of the emitter followers to which the output terminals Q and QN are connected. That is, high-speed operation can be achieved by increasing these currents. However, this will result in an increase in power dissipation. For example, when load capacitances associated with the output terminals Q and QN are large, a problem will arise in that, when large amounts of charge are extracted from the capacitances (at the fall time), the time required therefor becomes longer than for the rise time. However, the IOEF, which is a constant current, requires to be increased in order to improve the fall-time characteristic, which results in an increase in overall power dissipation.

As an approach to solve the above-described problem, an active pull-down (abbreviated to APD) circuit is disclosed in the paper entitled "Capacitor-free level-sensitive active pull-down ECL circuit with self-adjusting driving capability" by T. Kuroda, et al., in Symp. VLSI Circuits Dig. Tech. Paper, May 1993, pp. 29 to 30.

This APD circuit is effective in decreasing power dissipation-and increasing the operating speed (matching the fall time with the rise time). However, the APD circuit cannot be directly introduced into the vertically stacked ECL gate of FIG. 1; for, two nodes that are complementary to each other are required to obtain one output of the APD circuit. Such an arrangement is inconvenient for ECL gates that often use complementary outputs.

For reference, an APD version of the output stage of FIG. 1 is shown in FIG. 2. The emitter of the transistor Q110 connected to output terminal Q and the collector of the transistor Q101 of the differential pair A11 are connected by a resistor R111. The transistor Q101 has its collector connected to the base of the pull-down transistor Q111 for the output terminal Q. The transistor Q111 has its emitter connected to a regulated potential Vreg. Transistors Q119 through Q122 act as level-shift transistors.

The circuit operates in the following manner. Suppose here that the output terminal Q is at a high level. When the clock CK goes low, the transistor Q106 in the differential pair A13 turns on, enabling the differential pair A11. For example, when the input terminal D goes from a high level to a low level, the transistor Q101 turns off and the transistor Q102 turns on. As a result, a voltage drop across the resistor R111 decreases, turning the transistor Q111 on. On the other hand, a voltage drop across the resistor R102 increases, turning the transistor Q110 off. Thus, charges at the output terminal Q are forcibly extracted to the potential Vreg, causing the output terminal to go low. At the same time, the base potential of the transistor Q111 goes low and it turns off.

An APD version of the ECL gate is thus implemented by providing the transistor Q111 so that it will operate only when the potential at the output terminal Q goes low. As described above, in order to obtain the output Q, an output node complementary to Q is used; thus, in the arrangement of FIG. 2, unlike the arrangement of FIG. 1, the complementary output QN cannot be drawn out together with the output Q. The arrangement of FIG. 2 is therefore unsuitable for ECL circuits which often use complementary outputs.

In summary, when the load capacitances associated with the output terminals are large in the conventional circuit, the time taken to extract charges stored on the capacitances (the fall time) is longer than with the rise time. However, a higher-speed operation can be achieved by increasing the emitter follower output current (IOEF). An increase in the emitter follower current will however result in an increase in power dissipation. An APD version of the conventional circuit, which is intended to avoid increased power dissipation, cannot draw out complementary outputs, which will result in an arrangement that is unsuitable for ECL circuits.

SUMMARY OF THE INVENTION

It is therefore an object of the invention to provide an emitter-coupled logic circuit which is low in power dissipation, provides complementary output signals, and matches the fall time with the rise time to thereby achieve a high-speed operation.

The object is attained by an emitter-coupled logic circuit comprising: a first dual differential pair circuit having first and second current paths in a first differential current path activated by a first control signal and third and fourth current paths in a second differential current path activated by a second control signal, the first and third current paths constituting a first differential pair and the second and fourth current paths constituting a second differential pair; a first output terminal providing a first signal in response to the first differential pair circuit and a second output terminal providing a second signal complementary to the first signal; a first pull-down circuit for lowering the potential at the first output terminal; a second pull-down circuit for lowering the potential at the second output terminal; a first current switching circuit including the first differential pair and responsive to the first and second control signals for controlling the first signal at the first output terminal and the first pull-down circuit; and a second current switching circuit including the second differential pair and responsive to the first and second control signals for controlling the second signal at the second output terminal and the second pull-down circuit.

According to the invention, the first and second current switching circuits formed by the dual differential pair circuit are constantly activated to produce complementary currents in their differential current paths. Thereby, a complementary-output emitter-coupled logic circuit having first and second pull-down circuits built in is implemented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 shows a modification of the circuit of FIG. 5;

FIG. 8 shows a modification of the circuit of FIG. 6;

FIG. 9 is a circuit diagram of a two-input complementary-output multiplexer circuit according to a fifth embodiment of the invention;

FIG. 10 is a circuit diagram of a two-input complementary-output AND circuit according to a sixth embodiment of the invention;

FIG. 11 is a circuit diagram of a two-input complementary-output D-flip-flop circuit according to a seventh embodiment of the invention;

FIG. 12 is a first graph for comparison between a circuit of the invention and the conventional circuit; and FIG. 13 is a second graph for comparison between a circuit of the invention and the conventional circuit.

DETAILED DESCRIPTION OF THE PREFERRED EMBODIMENTS

Figure 3:
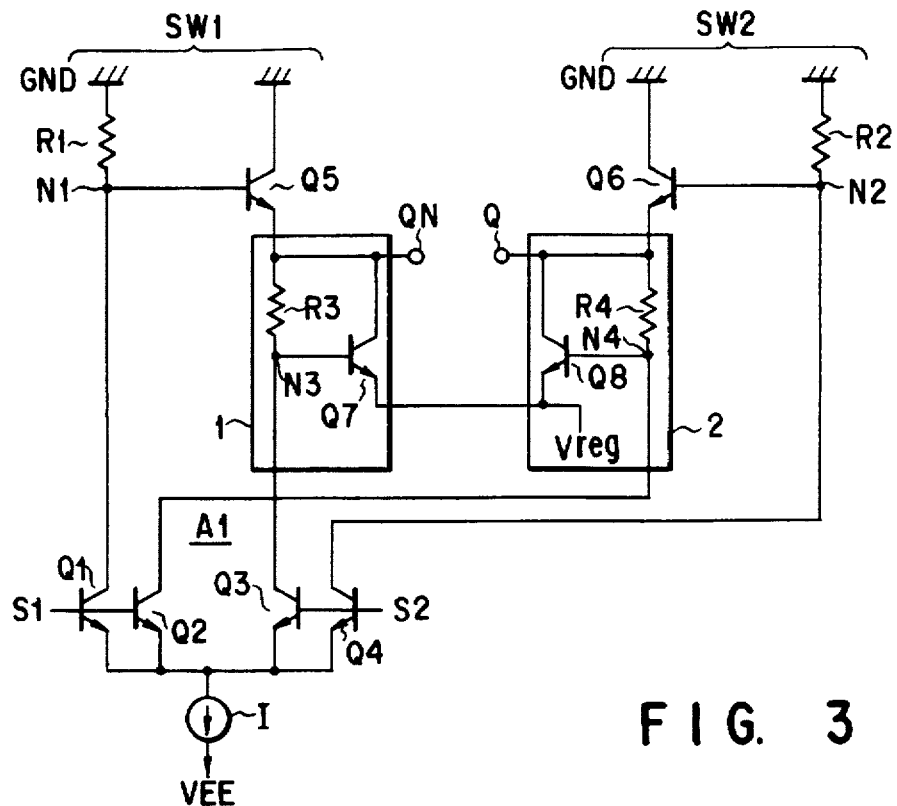
FIG 3 shows a principal part of an emitter-coupled logic circuit according to a first embodiment of the invention.

Referring now to FIG. 3, a circuit according to a first embodiment of the invention is provided with a dual differential- pair circuit A1 having active pull-down (APD) circuits 1 and 2 for providing complementary outputs Q and QN. The differential pair circuit A1 is provided in its differential current path with collector current paths of respective NPN transistors Q1 and Q2 driven by a control signal S1 and in its other differential current path with collector current paths of respective NPN transistors Q3 and Q4 driven by a control signal S2. Each of the collector current paths of the transistors Q1 to Q4 is coupled with a high-potential power supply GND (ground potential), while each of the emitter current paths is coupled with VEE (a negative potential) via a constant current source I to serve as an operation control current path of the differential pair circuit A1. A resistor R1 is connected between the collector of the transistor Q1 and GND. Between the collector of the transistor Q3 and GND are connected in series a resistor R3 and the current path of the transistor Q5, which has its base connected to a node N1 between one end of the resistor R1 and the collector of the transistor Q1. The output terminal QN is connected to the point between the emitter of the transistor Q5 and the other end of the resistor R3. Between the output terminal QN and a predetermined potential Vreg is connected the current path of a transistor Q7, which has its base connected to a node N3 between the resistor R3 and the collector of the transistor Q3. The resistor R3 and the transistor Q7 forms the APD circuit 1. The above arrangement forms a first current switch circuit SW1.

A resistor R2 is connected between the collector of the transistor Q4 and GND. Between the collector of the transistor Q2 and GND are connected in series a resistor R4 and the current path of an NPN transistor Q6, which has its base connected to a node N2 between the resistor R2 and the collector of the transistor Q4. The output terminal Q is connected to a point between the emitter of the transistor Q6 and the resistor R4. Between the output terminal Q and the predetermined potential Vreg is connected the current path of an NPN transistor Q8, which has its base connected to a node N4 between the resistor R4 and the collector of the transistor Q2. The APD circuit 2 is constructed from the resistor R4 and the transistor Q8. In this manner a second current switch circuit SW2 is formed.

The operation of the circuit of FIG. 3 will be described below. First, suppose that the output terminal Q is at a low level and the output terminal QN is at a high level. Further, suppose that the control signal S1 is low and the control signal S2 is high. Then, the transistors Q1 and Q2 are off and the transistors Q3 and Q4 are on, so that the transistor Q5 is on and the transistor Q6 is off.

Suppose that the control signal S1 goes high and the control signal S2 goes low, so that the transistors Q1 and Q2 are turned on and the transistors Q3 and Q4 are turned off. Then, current flows through the resistors R1 and R4, causing the potentials at the nodes N1 and N4 to go low. On the other hand, no current flows through the resistor R3, so that the node N3 goes to the same potential level as the output terminal Q. Thus, the transistor Q7 turns on, so that charges at the output terminal QN are forcibly extracted to the potential Vreg to thereby cause the potential at the output terminal QN to go low. At the same time, the potential at the node N3 goes low, turning the transistor Q7 off. On the other hand, the output terminal Q goes to the potential (high level) that is Vbe (the base-to-emitter voltage of transistor Q6) less than the GND potential because the node N2 is at the GND potential.

Suppose that the control signal S1 goes low and the control signal S2 goes high, so that the transistors Q1 and Q2 are turned off and the transistors Q3 and Q4 are turned on. Then, current flows through the resistors R2 and R3, causing the potentials at the nodes N2 and N3 to go low. On the other hand, no current flows through the resistor R4, so that the node N4 goes to the same potential level as the output terminal Q. Thus, the transistor Q8 turns on, so that charges at the output terminal Q are forcibly extracted to the potential Vreg to thereby cause the potential at the output terminal Q to go low. At the same time, the potential at the node N4 goes low, turning the transistor Q8 off. On the other hand, the output terminal QN goes to the potential (high level) that is Vbe (the base-to-emitter voltage of transistor Q5) less than the GND potential because the node N2 is at the GND potential.

According to the above-described arrangement, the differential pair circuit A1 has a dual configuration. Thus, both the current switch circuits SW1 and SW2 are constantly made active, permitting complementary currents to be flow in the differential current paths of the switch circuits. Thereby, the APD circuits 1 and 2 can be used effectively to provide complementary outputs. That is, a complementary output type of emitter-coupled logic circuit can be implemented which is low in power dissipation, shows a match between rise and fall delay times, and performs a high-speed operation. Therefore, the most suitable arrangement for ECL circuits that often use complementary outputs can be provided.

Figure 4:
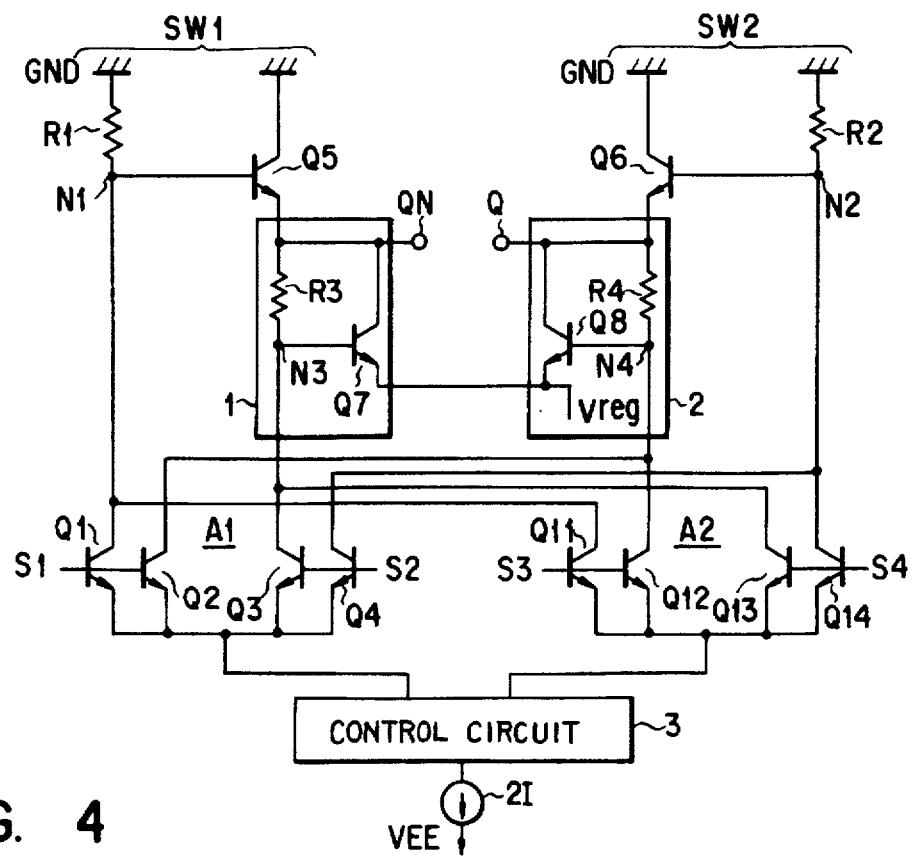
FIG. 4 shows a principal part of an emitter-coupled logic circuit according to a second embodiment of the invention.

FIG. 4 is a circuit diagram according to a second embodiment of the invention. A differential pair circuit A2 is provided such that each of its current paths is connected to a corresponding respective one of the current paths of the differential pair circuit A1. For example, control signals S3 and S4 for the differential pair circuit A2 are given temporally the same potential level with the control signals S1 and S2 of the differential pair circuit A1. The differential pair circuits A1 and A2 are provided with a control circuit 3 which controls the conduction of the operation control current paths through which emitter currents of the differential pairs flow. By the control circuit 3 the differential pair circuits are alternately switched into operation. The control circuit 3 connects to VEE through a constant current source 2I.

The operation of the circuit of FIG. 4 will be described. When the output terminals Q and QN are placed at certain complementary levels as described in connection with FIG. 3 and the control circuit 3 enables the differential pair circuit A2 in place of the differential pair circuit A1, the output levels at the output terminals are maintained by the differential pair circuit A2. Even if, at this point, the control signals S1 and S2 change their respective levels, the output levels at the output terminals Q and QN will not change because the differential pair circuit A1 is disabled by the control circuit 3. That is, the previous data will be held by the differential pair circuit A2. Therefore, a latch type of circuit can be constructed which has the advantages described in connection with FIG. 3.

Figure 5:
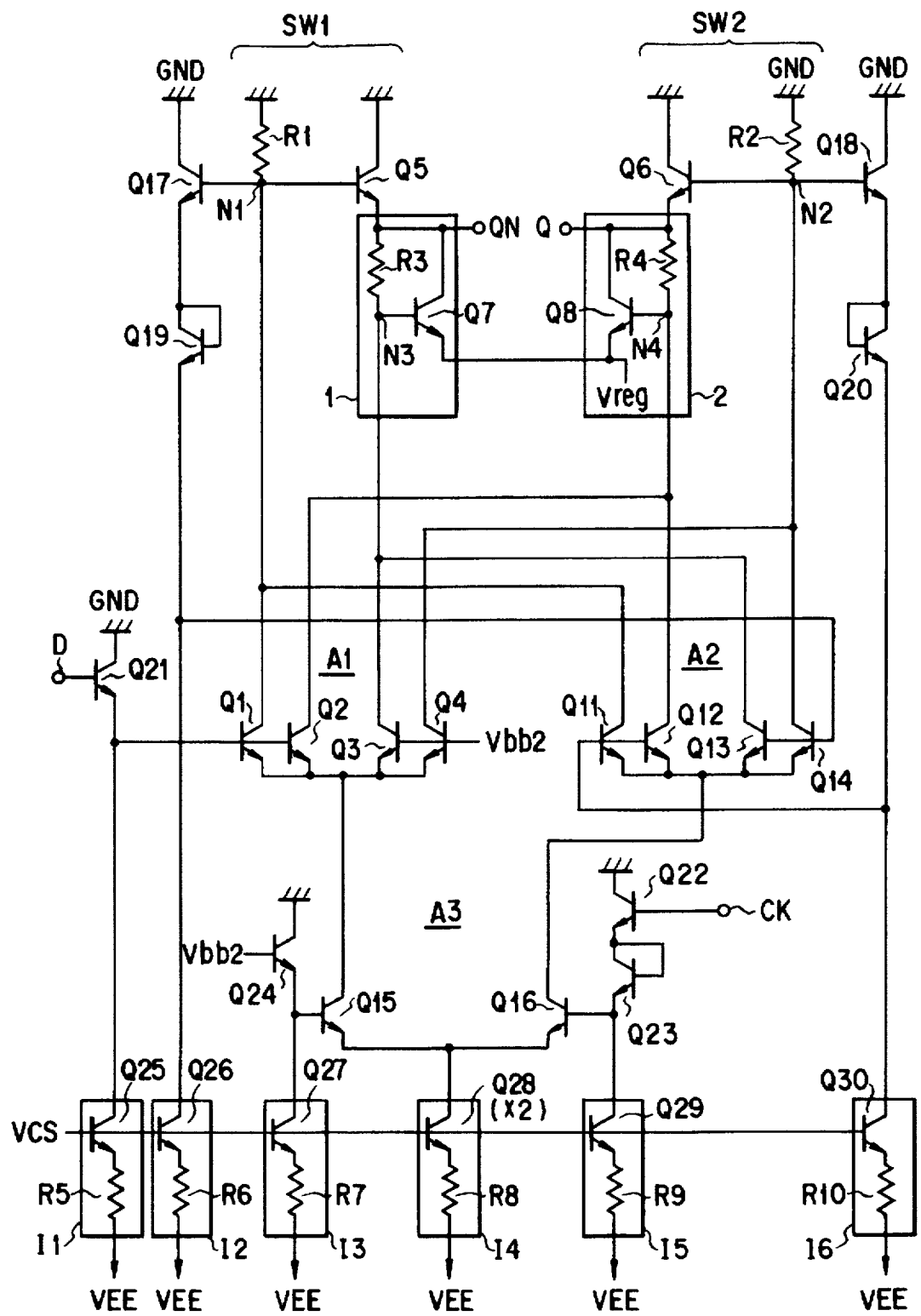
FIG. 5 is a circuit diagram of a D-latch circuit according to a third embodiment of the invention.

FIG. 5 is a circuit diagram of a D-latch circuit according to a third embodiment of the invention. The control circuit 3 of FIG. 4 consists of a differential pair circuit A3, in which its differential current path is connected to the operation control current path (emitter current path) of the differential pair circuit A1 and its other differential current path is connected to the operation control current path of the differential pair circuit A2. The operation control current path, i.e., the emitter current path, of the differential pair circuit A3 is connected by a constant current source I4 to VEE.

In the differential pair circuit A1, a control signal corresponding to data is applied to the common bases of the transistors Q1 and Q2 and a constant voltage Vbb2 is applied to the common bases of the transistors Q3 and Q4. The data input terminal D is connected to the base of the transistor Q21, which has its collector connected to GND and its emitter connected to the base of the transistor Q1 and to VEE through a constant current source I1.

In the differential pair circuit A2, if the clock CK is low level, a control signal to the common bases of the transistors Q11 and Q12 and a control signal to the common bases of the transistors Q13 and Q14 are the same voltage to the common bases of the transistors Q1 and Q2, and to the common bases of the transistors Q3 and Q4. That is as a circuit configuration, the current paths of NPN transistors Q20 and Q18 are connected in series between the common bases of the transistors Q11 and Q12 and GND. A constant current source I6 is connected between the common bases of the transistors Q11 and Q12 and VEE. The transistor Q20 has its base connected to its collector. The transistor Q18 has its base connected to the node N2 to which one end of the resistor R2 is connected. The current paths of NPN transistors Q19 and Q17 are connected in series between the common bases of the transistors Q13 and Q14 and GND. A constant current source I2 is connected between the common bases of the transistors Q13 and Q14 and VEE. The transistor Q19 has its base connected to its collector. The transistor Q17 has its base connected to the node N1 to which one end of the resistor R1 is connected.

In the differential pair circuit A3, a clock-based signal is applied to the base of a transistor Q16. A clock input terminal CK is connected to the base of an NPN transistor Q22, which has its collector connected to GND and its emitter connected to the base and collector of a transistor Q23. The transistor Q23 has its emitter connected to the base of the transistor Q16 and to VEE through a constant current source I5. An NPN transistor Q15 has its base connected to a potential corresponding to the constant voltage Vbb2. That is, the constant voltage Vbb2 is applied to the base of a transistor Q24, which has its collector connected to GND and its emitter connected to the base of the transistor Q15 and to VEE through a constant current source I3. The operation control current path, i.e., the emitter current path, of the differential pair circuit A3 connects to VEE through a constant current source I4.

The transistors Q19 through Q24 are level-shift transistors. Each of the current sources I1 through I6 consists of a series combination of an NPN transistor having its base connected to a constant voltage VCS and a resistor. It is assumed that each of the current source I1 (Q25, R5), I2 (Q26, R6), I3 (Q27, R7), I5 (Q29, R9), and I6 (Q30, R10) provides a current of 70 λA. In the current source I4, a transistor Q28 is formed to have double the size of the other current source transistors and a resistor R8 is formed to have one-fourth the resistance of the resistors R1 through R4. A current (ISW) provided by the current source I4 consisting of the transistor Q28 and the resistor R8 is assumed here to be ISW=470 µA though it may vary according to the load capacitances associated with the output terminals Q and QN and the operating speed required.

The circuit of FIG. 5 is identical in basic operation to the circuits of FIGS. 3 and 4. First, suppose that the output terminal QN is at a high level and the output terminal Q is at a low level. When the clock input terminal CK goes to a low level, the transistors Q15 of the differential pair circuit A3 turns on, allowing the differential pair circuit A3 to operate. If, at this point, the data input terminal D is at a high level, the transistors Q1 and Q2 will turn on, lowering the potentials at the nodes N1 and N4 as a result of current flowing through the resistors R1 and R4. On the other hand, the potential at the node N2 goes to GND and the potential at the node N3 becomes equal to that at the output terminal QN. Thus, the APD circuit 1 operates, so that the output terminal QN goes to a low level and the output terminal Q goes to a high level. At this point, the nodes N3 and N4 are at substantially the same potential. With reference to this potential, the predetermined potential Vreg is set so that no current will flow through the transistors Q7 and Q8.

When the clock goes high, the transistor Q16 of the differential pair circuit A3 is turned on, allowing the differential pair circuit A2 to operate in place of the differential pair circuit A1. This will keep the states of the output terminals Q and QN. That is, even if the next data is applied to the differential pair circuit A1, since it is disabled by the differential pair circuit A3, the output levels at the output terminals Q and QN will not change. Thus, the last data (data so far) will be held by the differential pair circuit A3.

Figure 1:
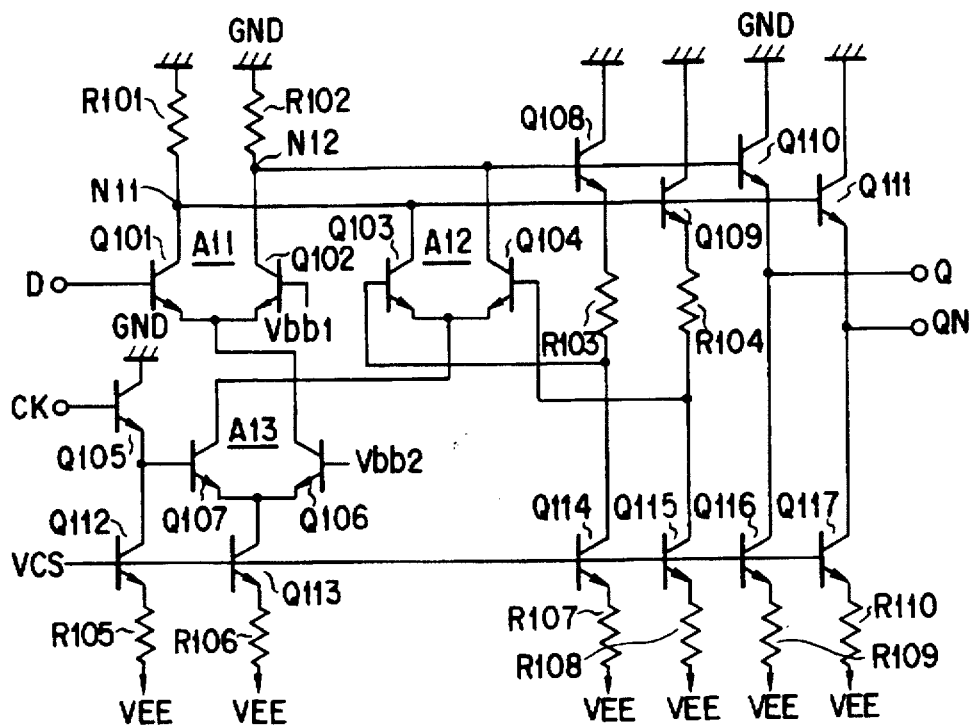
FIG. 1 is a circuit diagram of a conventional complementary-output D-latch circuit.
Figure 2:
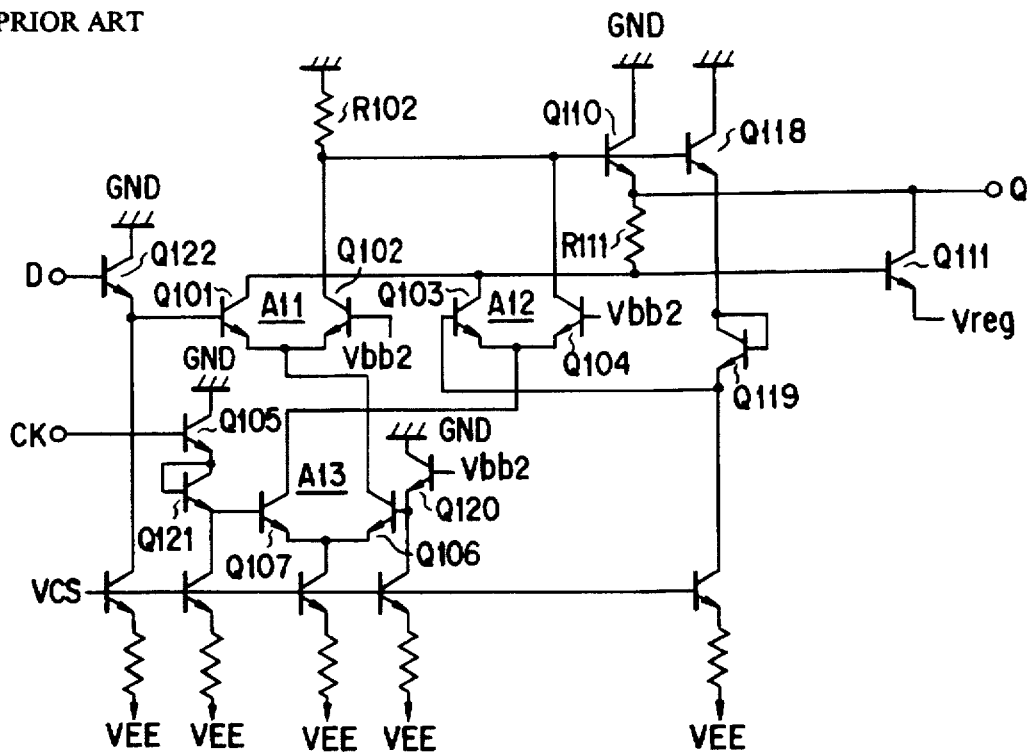
FIG. 2 shows an APD version of the output stage of FIG. 1.

According to the circuit arrangement described above, unlike the circuit arrangement of FIG. 1, there is no need of increasing the emitter follower current IOEF in order to improve the fall time and moreover, unlike the circuit arrangement of FIG. 2, complementary outputs can be obtained even if APD circuits are added. Thus, a circuit arrangement can be provided which is low in power dissipation and achieves a high-speed operation with the fall time matched with the rise time.

Figure 6:
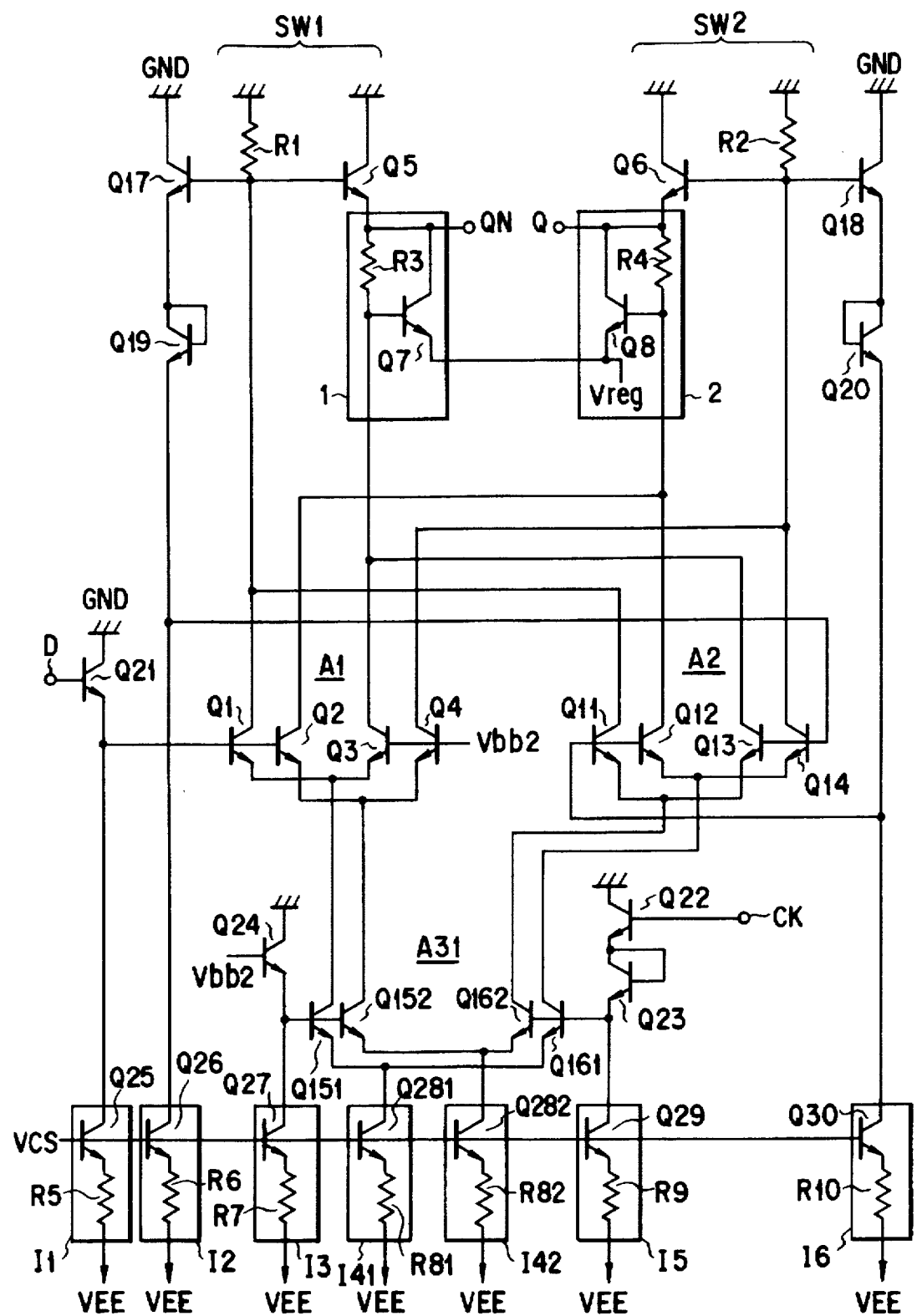
FIG. 6 shows a modification of the D-latch circuit of FIG. 5 according to a fourth embodiment of the invention.

FIG. 6 shows a modification of the D-latch circuit of FIG. 5 as a fourth embodiment of the invention, which is arranged to eliminate the effect of unbalance among differential currents on variations in the base-to-emitter voltage Vbe of transistors in the differential current paths of the differential pair circuits depending on the manufacturing process. To this end, the operation control current path, i.e., the emitter current path, of a differential pair circuit A31 is divided into two.

The emitter current path of the differential pair of transistors Q1 and Q3 in the differential pair circuit A1 is connected to the collector of a transistor Q151 of the differential pair circuit A31. The emitter current path of the differential pair of transistors Q2 and Q4 in the differential pair circuit A1 is connected to the collector of a transistor Q152 of the differential pair circuit A31. The emitter current path of the differential pair of transistors Q12 and Q14 in the differential pair circuit A2 is connected to the collector of a transistor Q161 of the differential pair circuit A31. The emitter current path of the differential pair of transistors Q11 and Q13 in the differential pair circuit A2 is connected to the collector of a transistor Q162 of the differential pair circuit A31. The emitter current path of the differential pair of transistors Q151 and Q161 in the differential pair circuit A31 is connected to VEE through a constant current source 141. The emitter current path of the differential pair of transistors Q152 and Q162 in the differential pair circuit A31 is connected to VEE through a constant current source 142. In comparison with the circuit arrangement of FIG. 5, in the circuit arrangement of FIG. 6, ISW is divided into a constant current source I41 (ISW1) and a constant current source I42 (ISW2). For this reason, each of the resistors R1 through R4 is formed to have twice the resistance of resistors R81 and R82. It is assumed that ISW1=ISW2=240 µA in order to render similar to operation speed of the circuit of FIG. 5. The operation of this circuit is the same as that of the circuit of FIG. 5 and hence the description thereof is omitted.

FIG. 7 shows a modification of the circuit of FIG. 5, which is distinct from the FIG. 5 circuit in that a clock-based signal is applied to the base of the NPN transistor Q15 and a voltage corresponding to a constant voltage Vbb2 is applied to the base of the NPN transistor Q16. When the clock input terminal CK is at a high level, the differential pair circuit A1 is enabled; otherwise, the differential pair circuit A2 is enabled, allowing the output terminals Q and QN to hold the last data.

FIG. 8 shows a modification of the circuit of FIG. 6, which is distinct from the FIG. 6 circuit in that a signal corresponding to the clock signal is applied in common to the bases of NPN transistors Q151 and Q152 and a voltage corresponding to the constant voltage Vbb2 is applied in common to the bases of NPN transistors Q161 and Q162. This circuit operates identically to the circuit of FIG. 7.

FIG. 9 is a circuit diagram of a two-input complementary-output multiplexer according to a fifth embodiment of the invention, which is distinct from the circuit of FIG. 8 in that the way of applying potentials to the bases of the transistors in the differential pair circuit A2 is made to correspond to that in the differential pair circuit A1. In the differential pair circuit A1, a signal corresponding to a D1 signal is applied to the common bases of the transistors Q1 and Q2. The D signal input terminal is connected to the base of the NPN transistor Q21, which has its collector connected to GND and its emitter connected to the base of the transistor Q1 and to VEE through the constant current source I1. The constant voltage Vbb2 is applied to the common bases of the transistors Q3 and Q4.

In the differential pair circuit A2, a signal corresponding to a D0 signal is applied to the common bases of the transistors Q11 and Q12. The D0 signal input terminal is connected to the base of the NPN transistor Q31, which has its collector connected to GND and its emitter connected to the base of the transistor Q11 and to VEE through the constant current source I2. The constant voltage Vbb2 is applied to the common bases of the transistors Q13 and Q14. In the arrangement of FIG. 9, the clock signal input terminal CK in FIG. 8 is replaced with a select signal input terminal S.

The basic operation of the circuit of FIG. 9 is the same as that of the circuit of FIG. 6. That is, the D1 signal and the D0 signal are applied to the differential pair circuits A1 and A2, respectively, through the respective data input terminals and either of the differential pair circuits is selectively enabled by the select signal, thus providing complementary outputs corresponding to the D1 input or the D0 input.

FIG. 10 is a circuit diagram of a two-input complementary-output AND circuit according to a sixth embodiment of the invention. The FIG. 10 circuit is distinct from the circuit of FIG. 9 in that the circuit associated with the D0 signal input shown in FIG. 9 is excluded from the differential pair circuit A2 and the differential pair circuits A1 and A2 are connected so that AND logic is implemented.

To be specific, the common bases of the transistors Q11 and Q12 in the differential pair circuit A2 are connected to the constant voltage Vbb2 to which the common bases of the transistors Q3 and Q4 in the differential pair circuit A1 are connected. The common bases of the transistors Q13 and Q14 in the differential pair circuit A1 are connected to the common bases of the transistors Q1 and Q2 in the differential pair circuit A1. The collectors of the transistors Q11 and Q14 in the differential pair circuit A2 are connected to the collector of the transistor Q3 in the differential pair circuit A1. The collector of the transistor Q13 is connected to GND through the resistor R2. The bases of the transistors Q21 and Q22 are used as input terminals for signals B1 and B2, respectively. The complementary outputs of the AND circuit for ANDing the signals B1 and B2 are obtained at the output terminals QN and Q. Here, the current paths of the current switching circuits SW1 and SW2 are numbered 61 through 64, respectively. When both the input signals B1 and B2 go high, the transistors Q1 and Q2 in the differential pair A1 turn on and the corresponding current paths 61 and 63 are made active, thereby providing the corresponding complementary outputs to the input signals. In other combinations of the input signals B1 and B2, the current paths 62 and 64 are made active, thereby providing the corresponding complementary outputs. According to such a circuit arrangement, AND logic with complementary outputs is implemented.

FIG. 11 is a circuit diagram of a D-flip-flop circuit according to a seventh embodiment of the invention, which uses a cascade of two D-latch circuits, the latch on the data input side serving as the master (MAS) and the other serving as the slave (SLV). The master latch has the same circuit arrangement as the circuit of FIG. 1, while the slave latch has the same circuit arrangement as the circuit of FIG. 8. Resistors R21, R22, R1, R3 and R4 each have twice the resistance of resistors R81 and R82.

In the circuit arrangement of FIG. 11, when clock CK is low, a differential pair circuit A4 in the master latch is enabled to accept a data signal D. At this time, in the slave latch, the differential pair circuit A1 is disabled, while the differential pair circuit A2 is enabled. Thus, even if another data is transmitted over lines MO and BMO according to a change in D, the previous data is held at the output terminals Q and QN by the differential pair circuit A2. When the clock CK goes high, the differential pair circuit A1 is disabled and the differential pair circuit A5 is enabled to thereby latch the data signal D at this time. In the slave latch, on the other hand, the differential pair circuit A2 is disabled and the differential pair circuit A1 is enabled. Thus, the data held by the differential pair circuit A5 in the master latch is transferred over the lines MO and BMO to the slave latch, whereby complementary outputs corresponding to the data signal D are obtained at the output terminals Q and QN. When the clock CK goes low again, the differential pair circuit A4 in the master latch is enabled to accept the data signal D, but, in the slave latch, the differential pair circuit A1 is disabled and the differential pair circuit A2 is enabled. Thus, even if another data is transferred over the lines MO and BMO according to a change in D, the previous data will be held at the output terminals Q and QN by the differential pair circuit A2 unless the clock Ck goes high.

FIG. 12 is a first graph for a comparison between an arrangement of the invention and a conventional arrangement. Specifically, the graph shows a comparison between the D-latch circuit of FIG. 5 and the D-latch circuit of FIG. 1. The abscissa indicates metal line length (mm) in the circuit arrangement and the ordinate indicates delay time Tpd (ps) associated with circuit operation. F5-1 and F5-2 indicate the amount of delay associated with data and the amount of delay associated with clock, respectively, in the circuit of FIG. 5. F1-1 and F1-2 indicate the amount of delay associated with data and the amount of delay associated with clock, respectively, in the circuit of FIG. 1. The operating conditions are such that VEE=−5.2 V, and power dissipation is 4.3 mW in the circuit of FIG. 5 and 8.2 mW in the circuit of FIG. 1. The metal line is made of aluminum and the junction temperature Tj is Tj=80° C. With the average metal line length 2 mm (metal line load capacitance: 0.252 pF/mm), power required to obtain the same Tpd as in the conventional circuit can be reduced to about 50%.

FIG. 13 is a second graph for a comparison between a circuit arrangement of the invention and a conventional circuit arrangement. Specifically, the graph shows a comparison between the D-latch circuit (F5) of FIG. 5 and the conventional D-latch circuit (F1) of FIG. 1. The abscissa indicates power (mW) and the ordinate indicates delay time Tpd (ps) associated with circuit operation. The operating conditions are such that VEE=−5.2 V, metal line (aluminum) length=2 mm, and junction temperature Tj=80° C. As indicated by a broken line P1, at approximately the same power dissipation the speed of circuit operation can be increased by a factor of about 2.4. For Tpd, power dissipation can be significantly reduced to obtain the same level of Tpd. For the level of Tpd indicated by a broken line P2, the power dissipation in the circuit of FIG. 5 is $1/1.9$ of that in the conventional circuit. To obtain the same level of Tpd with a metal line length of 4 mm, the power dissipation could be reduced to about 40% of that in the conventional circuit.

As described above, each of the embodiments can achieve an APD version of vertically stacked circuits with complementary outputs, which has been considered to be difficult. That is, by a dual differential-pair arrangement with two current switch circuits (SW1, SW2) that are alternately activated, a vertically stacked ECL circuit with complementary outputs can be constructed to include APD circuits. Therefore, according to the invention, the need of increasing emitter follower currents to improve the falling speed can be eliminated and the fall time can be matched with the rise time to thereby an emitter-coupled logic circuit with complementary outputs which is low in power dissipation and fast in operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An emitter-coupled logic circuit comprising:

a first dual differential pair circuit having first and second current paths in a first differential current path activated by a first control signal and third and fourth current paths in a second differential current path activated by a second control signal, said first and third current paths constituting a first differential pair and said second and fourth current paths constituting a second differential pair;

a first output terminal providing a first signal in response to said first differential pair circuit and a second output terminal providing a second signal complementary to said first signal;

a first pull-down circuit responsive to said first and second control signals for lowering the potential at said first output terminal;

a second pull-down circuit responsive to said first and second control signals for lowering the potential at said second output terminal;

a second differential pair circuit having differential circuit paths connected to at least two of said first, second, third and fourth current paths; and a control circuit for alternately enabling said first and second differential pair circuits.

2. An emitter-coupled logic circuit comprising:

a first dual differential pair circuit having first and second current paths in a first differential current path activated by a first control signal and third and fourth current paths in a second differential current path activated by a second control signal, said first and third current paths constituting a first differential pair and said second and fourth current paths constituting a second differential pair:

a first output terminal providing a first signal in response to said first differential pair circuit and a second output terminal providing a second signal complementary to said first signal:

a first pull-down circuit responsive to said first and second control signals for lowering the potential at said first output terminal:

a second pull-down circuit responsive to said first and second control signals for lowering the potential at said second output terminal:

a second dual differential pair circuit having fifth, sixth, seventh and eight current paths respectively connected in parallel with said first, second, third and fourth current paths; and a control circuit for alternately enabling said first and second differential pair circuits, said fifth and seventh current paths constituting a third differential pair and said sixth and eight current paths constituting a fourth differential pair, and wherein said control circuit disables said first differential pair circuit and enables said second differential pair circuit to hold said first and second signals produced by said first differential pair circuit regardless of said first and second control signals.

3. The emitter-coupled logic circuit according to claim 2, wherein said control circuit comprises a third differential pair circuit having its differential current path connected to an operation control current path of said first differential pair circuit and its other differential current path connected to an operation control current path of said second differential pair circuit, said third differential pair circuit being responsive to at least a third control signal to alternately enable said first and second differential pair circuits.

4. The emitter-coupled logic circuit according to claim 2, wherein said control circuit comprises a third dual differential pair circuit having ninth and tenth current paths in its one differential current path activated by a third control signal and eleventh and twelfth current paths in its other differential current path activated by a fourth control signal, said ninth and twelfth current paths constituting a fifth differential pair and said tenth and eleventh current paths constituting a sixth differential pair, and wherein said ninth current path is connected to an operation control current path of said first differential pair in said first differential pair circuit, said tenth current path is connected to an operation control current path of said second differential pair in said first differential pair circuit, said eleventh current path is connected to an operation control current path of said third differential pair in said second differential pair circuit, said twelfth current path is connected to an operation control current path of said fourth differential pair in said second differential pair circuit, and said third differential pair circuit is responsive to at least a third control signal to alternately enable said first and second differential pair circuits.

5. An emitter-coupled logic circuit comprising:

first and second input nodes;

first and second output nodes;

a first NPN transistor circuit having its base connected to a first reference potential;

a second NPN transistor circuit having its base connected to an input the potential at which is level shifted by two stages of emitter follower with respect to the potential at said first input node and its emitter connected to the emitter of said first NPN transistor;

a constant current source connected between the emitters of said first and second NPN transistor circuits and a low-potential power supply;

third and fourth NPN transistors each having its base connected to an input the potential at which is level shifted by one stage of emitter follower with respect to said second input node and its emitter connected to the collector of said first NPN transistor circuit;

fifth and sixth NPN transistors each having its base connected to a second reference potential and its emitter connected to the collector of said first NPN transistor circuit;

seventh and eighth NPN transistors each having its base connected to a first constant current source biased said low-potential power supply and its emitter connected to the collector of said second NPN transistor circuit;

ninth and tenth NPN transistors each having its base connected to a second constant current source biased said low-potential power supply and its emitter connected to the collector of said second NPN transistor circuit;

a first resistor connected between a high-potential power-supply and the collectors of said third and seventh NPN transistors;

a second resistor connected between said first output node and the collectors of said fifth and ninth NPN transistors;

a third resistor connected between said second output node and the collectors of said fourth and eighth NPN transistors;

a fourth resistor connected between said high-potential power supply and the collectors of said sixth and tenth NPN transistors;

an eleventh NPN transistor having its collector connected to said high-potential power supply, its base connected to the collectors of said third and seventh NPN transistors and its emitter connected to said first output node;

a twelfth NPN transistor having its collector connected to said output node, its base connected to the collectors of said fifth and ninth NPN transistors and its emitter connected to a third reference potential;

a thirteenth NPN transistor having its collector connected to said second output node, its base connected to the collectors of said fourth and eighth NPN transistors and its emitter connected to said third reference potential; and a fourteenth NPN transistor having its collector connected to said high-potential power supply, its base connected to the collectors of said sixth and tenth NPN transistors and its emitter connected to said second output node.

6. An emitter-coupled logic circuit comprising:

first, second and third input nodes;

first and second output nodes;

a first NPN transistor circuit having its base connected to an input which is connected to said first input node through two stages of emitter follower;

a second NPN transistor circuit having its base connected to a first reference potential and its emitter connected to the emitter of said first NPN transistor;

a constant current source connected between the emitters of said first and second NPN transistor circuits and a low-potential power supply;

third and fourth NPN transistors each having its base connected to an input which is connected to said second input node through one stage of emitter follower and its emitter connected to the collector of said first NPN transistor circuit;

fifth and sixth NPN transistors each having its base connected to a second reference potential and its emitter connected to the collector of said first NPN transistor circuit;

seventh and eighth NPN transistors each having its base connected to an input which is connected to said third input node through one stage of emitter follower and its emitter connected to the collector of said second NPN transistor circuit;

ninth and tenth NPN transistors each having its base connected to a second constant current source and its emitter connected to the collector of said second NPN transistor circuit;

a first resistor connected between a high-potential power supply and the collectors of said third and seventh NPN transistors;

a second resistor connected between said first output node and the collectors of said fifth and ninth NPN transistors;

a third resistor connected between said second output node and the collectors of said fourth and eighth NPN transistors;

a fourth resistor connected between said high-potential power supply and the collectors of said sixth and tenth NPN transistors;

an eleventh NPN transistor having its collector connected to said high-potential power supply, its base connected to the collectors of said third and seventh NPN transistors and its emitter connected to said first output node;

a twelfth NPN transistor having its collector connected to said output node, its base connected to the collectors of said fifth and ninth NPN transistors and its emitter connected to a third reference potential;

a thirteenth NPN transistor having its collector connected to said second output node, its base connected to the collectors of said fourth and eighth NPN transistors and its emitter connected to third reference potential; and a fourteenth NPN transistor having its collector connected to said high-potential power supply, its base connected to the collectors of said sixth and tenth NPN transistors and its emitter connected to said second output node.

7. The emitter-coupled logic circuit according to claim 5 or 6, wherein said first NPN transistor circuit includes a fifteenth NPN transistor having its collector connected to the emitters of said third and fifth NPN transistors and a sixteenth NPN transistor having its collector connected to the emitters of fourth and sixth NPN transistors, said second NPN transistor circuit includes a seventeenth NPN transistor having its collector connected to the emitters of said seventh and ninth NPN transistors and an eighteenth NPN transistor having its collector connected to the emitters of said eighth and tenth NPN transistors.

8. An emitter-coupled logic circuit comprising:

first and second input nodes;

first and second output nodes;

a first NPN transistor circuit having its base connected to an input which is connected to said first input node through two stages of emitter follower;

a second NPN transistor circuit having its base connected to a first reference potential and its emitter connected to the emitter of said first NPN transistor;

a constant current source connected between the emitters of said first and second NPN transistor circuits and a low-potential power supply;

third and fourth NPN transistors each having its base connected to an input which is connected to said second input node through one stage of emitter follower and its emitter connected to the collector of said first NPN transistor circuit;

fifth and sixth NPN transistors each having its base connected to a second reference potential and its emitter connected to the collector of said first NPN transistor circuit;

seventh and eighth NPN transistors each having its base connected to said second reference potential and its emitter connected to the collector of said second NPN transistor circuit;

ninth and tenth NPN transistors each having its base connected to an input which is connected to said second input node through one stage of emitter flower and its emitter connected to the collector of said second NPN transistor circuit;

a first resistor connected between a high-potential power supply and the collector of said third NPN transistor;

a second resistor connected between said first output node and the collectors of said fifth, seventh and tenth NPN transistors;

a third resistor connected between said second output node and the collector of said fourth NPN transistor;

a fourth resistor connected between said high-potential power supply and the collectors of said sixth, eighth and ninth NPN transistors;

an eleventh NPN transistor having its collector connected to said high-potential power supply, its base connected to the collector of said third NPN transistor and its emitter connected to said first output node;

a twelfth NPN transistor having its collector connected to said output node, its base connected to the collectors of said fifth, seventh and tenth NPN transistors and its emitter connected to a third reference potential;

a thirteenth NPN transistor having its collector connected to said second output node, its base connected to the collector of said fourth NPN transistor and its emitter connected to said third reference potential; and a fourteenth NPN transistor having its collector connected to said high-potential power supply, its base connected to the collectors of said sixth, eighth and ninth NPN transistors and its emitter connected to said second output node.

9. The emitter-coupled logic circuit according to claim 8 or 6, wherein said first NPN transistor circuit includes a fifteenth NPN transistor having its collector connected to the emitters of said third and fifth NPN transistors and a sixteenth NPN transistor having its collector connected to the emitters of fourth and sixth NPN transistors, said second NPN transistor circuit includes a seventeenth NPN transistor having its collector connected to the emitters of said seventh and ninth NPN transistors and an eighteenth NPN transistor having its collector connected to the emitters of said eighth and tenth NPN transistors.

10. An emitter-coupled logic circuit comprising:

first and second input nodes;

first and second output nodes;

a first NPN transistor circuit having its base connected to a first reference potential;

a second NPN transistor circuit having its base connected to an input the potential at which is level shifted by two stages of emitter follower with respect to the potential at said first input node and its emitter connected to the emitter of said first NPN transistor;

a constant current source connected between the emitters of said first and second NPN transistor circuits and a low-potential power supply;

third and fourth NPN transistors each having its base connected to an input the potential at which is level shifted by one stage of emitter follower with respect to said second input node and its emitter connected to the collector of said first NPN transistor circuit;

fifth and sixth NPN transistors each having its base connected to a second reference potential and its emitter connected to the collector of said first NPN transistor circuit;

seventh and eighth NPN transistors each having its base connected to a first constant current source biased said low-potential power supply and its emitter connected to the collector of said second NPN transistor circuit;

ninth and tenth NPN transistors each having its base connected to a second constant current source biased said low-potential power supply and its emitter connected to the collector of said second NPN transistor circuit;

a first resistor connected between a high-potential power supply and the collectors of said third and seventh NPN transistors;

a second resistor connected between said first output node and the collectors of said fifth and ninth NPN transistors;

a third resistor connected between said second output node and the collectors of said fourth and eighth NPN transistors;

a fourth resistor connected between said high-potential power supply and the collectors of said sixth and tenth NPN transistors;

an eleventh NPN transistor having its collector connected to said high-potential power supply, its base connected to the collectors of said third and seventh NPN transistors and its emitter connected to said first output node;

a twelfth NPN transistor having its collector connected to said output node, its base connected to the collectors of said fifth and ninth NPN transistors and its emitter connected to a third reference potential;

a thirteenth NPN transistor having its collector connected to said second output node, its base connected to the collectors of said fourth and eighth NPN transistors and its emitter connected to said third reference potential;

a fourteenth NPN transistor having its collector connected to said high-potential power supply, its base connected to the collectors of said sixth and tenth NPN transistors and its emitter connected to said second output node;

a nineteenth NPN transistor having its collector connected to said high-potential power supply and its base connected to the base of said eleventh NPN transistor and its emitter coupled with each base of said ninth and tenth NPN transistors through a first diode element; and a twentieth NPN transistor having its collector connected to said high-potential power supply and its base connected to the base of said fourteenth NPN transistor and its emitter coupled with each base of said seventh and eighth NPN transistors through a second diode element.

11. The emitter-coupled logic circuit according to claim 10, wherein said first NPN transistor circuit includes a fifteenth NPN transistor having its collector connected to the emitters of said third and fifth NPN transistors and a sixteenth NPN transistor having its collector connected to the emitters of fourth and sixth NPN transistors, said second NPN transistor circuit includes a seventeenth NPN transistor having its collector connected to the emitters of said seventh and ninth NPN transistors and an eighteenth NPN transistor having its collector connected to the emitters of said eighth and tenth NPN transistors.

* * * * *